United States Patent
Kitamura et al.

(10) Patent No.: US 12,119,250 B2
(45) Date of Patent: Oct. 15, 2024

(54) TRANSPORT SYSTEM AND GRID SYSTEM

(71) Applicant: Murata Machinery, Ltd., Kyoto (JP)

(72) Inventors: Wataru Kitamura, Inuyama (JP); Eijiro Aoki, Inuyama (JP); Toshikazu Nakagawa, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 359 days.

(21) Appl. No.: 17/772,284

(22) PCT Filed: Jul. 27, 2020

(86) PCT No.: PCT/JP2020/028769
§ 371 (c)(1),
(2) Date: Apr. 27, 2022

(87) PCT Pub. No.: WO2021/090543
PCT Pub. Date: May 14, 2021

(65) Prior Publication Data
US 2022/0384229 A1 Dec. 1, 2022

(30) Foreign Application Priority Data
Nov. 7, 2019 (JP) .................................. 2019-202369

(51) Int. Cl.
| | | |
|---|---|---|
| *H01L 21/677* | (2006.01) | |
| *B65G 1/04* | (2006.01) | |
| *G05D 1/00* | (2006.01) | |

(52) U.S. Cl.
CPC ...... *H01L 21/67724* (2013.01); *B65G 1/0457* (2013.01); *G05D 1/0287* (2013.01);
(Continued)

(58) Field of Classification Search
CPC ........... H01L 21/67724; H01L 21/6773; H01L 21/67733; B65G 1/0457; B65G 2201/0297; G05D 1/0287
See application file for complete search history.

(56) References Cited

U.S. PATENT DOCUMENTS 11,171,027 B2   11/2021  Ito
2013/0302132 A1  11/2013  D'Andrea
(Continued)

FOREIGN PATENT DOCUMENTS

JP   H11-143535 A    5/1999
JP   2017-134794 A   8/2017
(Continued)

OTHER PUBLICATIONS

International Search Report dated Oct. 13, 2020 in counterpart International Application No. PCT/JP2020/028769.
(Continued)

*Primary Examiner* — Jacob M Amick
(74) *Attorney, Agent, or Firm* — DLA Piper LLP (US)

(57) ABSTRACT

A transport system includes a plurality of transport vehicles and a controller. The transport vehicle includes a travel unit and transfer unit. The controller performs a blocking control to prohibit transport vehicles other than the transport vehicle from entering a blocking zone corresponding to the area occupied by the transport vehicle when transferring an article in a plan view. To transfer an article from/to a placement table, the transport vehicle travels along the route to the placement table in a first direction. An area of the blocking zone when the transport vehicle accesses to the placement table in the first direction is equal to or less than an area of the blocking zone identified when the transport vehicle accesses to the placement table in the second direction different from the first direction.

12 Claims, 13 Drawing Sheets

(52) U.S. Cl.
CPC .... *H01L 21/6773* (2013.01); *H01L 21/67733* (2013.01); *B65G 2201/0297* (2013.01)

(56) References Cited

U.S. PATENT DOCUMENTS

| | | |
|---|---|---|
| 2017/0233187 A1 | 8/2017 | Fukushima |
| 2018/0319590 A1 | 11/2018 | Lindbo et al. |
| 2019/0318950 A1 | 10/2019 | Takahara |
| 2020/0343118 A1 | 10/2020 | Torazawa et al. |

FOREIGN PATENT DOCUMENTS

| | | | | |
|---|---|---|---|---|
| JP | 2019-500294 A | | 1/2019 | |
| JP | 2019-081639 A | | 5/2019 | |
| WO | WO-2016039023 A1 | * | 3/2016 | ............... B65G 1/04 |
| WO | 2018/110178 A1 | | 6/2018 | |
| WO | 2018/211898 A1 | | 11/2018 | |
| WO | WO-2018210923 A1 | * | 11/2018 | ............... B61B 5/02 |
| WO | 2019/101725 A1 | | 5/2019 | |

OTHER PUBLICATIONS

Written Opinion dated Oct. 13, 2020 in counterpart International Application No. PCT/JP2020/028769.
An English translation of the International Preliminary Report on Patentability and Written Opinion dated May 19, 2022, of counterpart PCT International Application No. PCT/JP2020/028769.
Extended European Search Report dated Oct. 9, 2023, of counterpart European Patent Application No. 20884547.9.

* cited by examiner

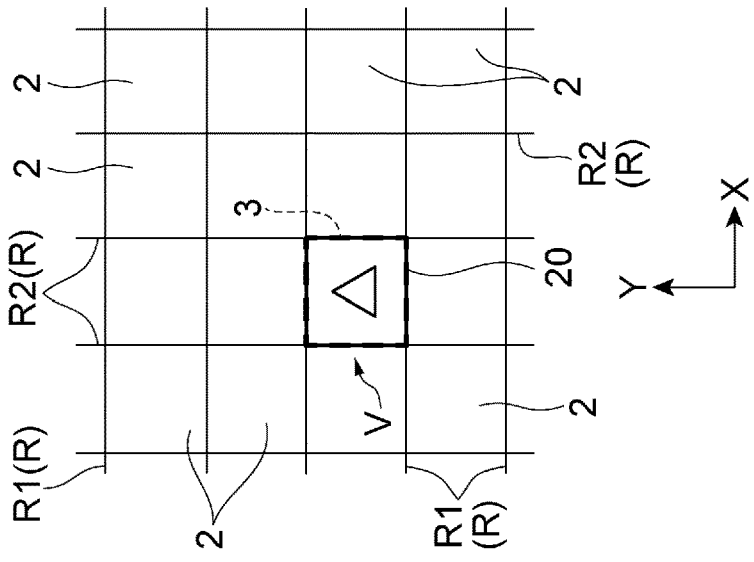
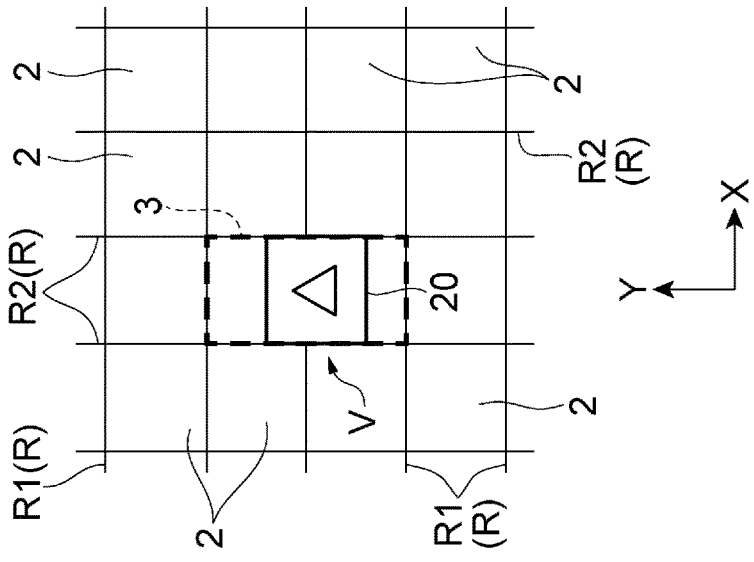
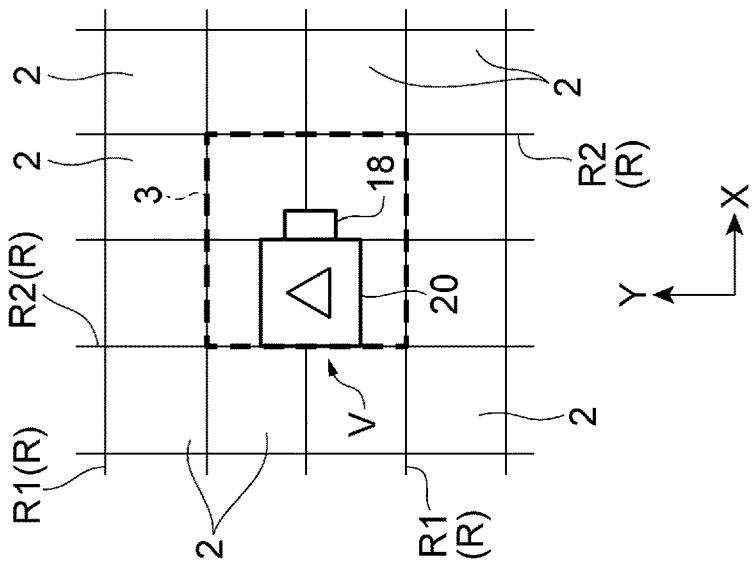

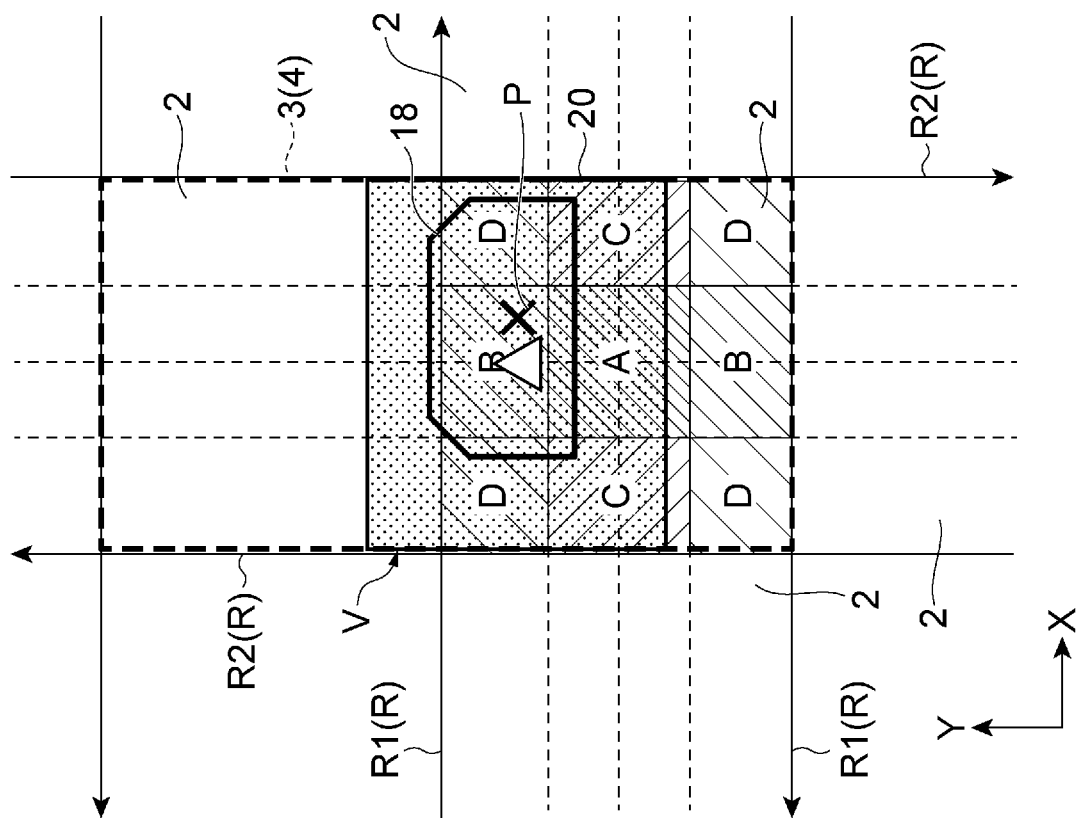
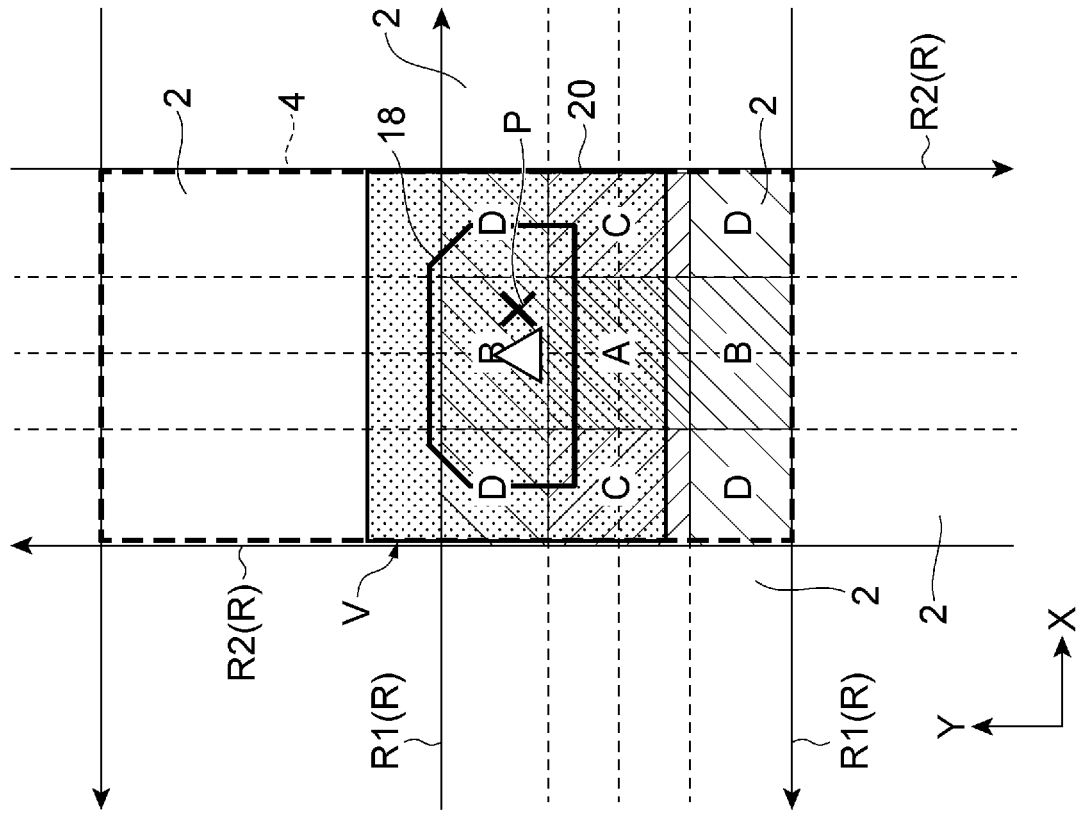

| Port No. | The number of block when access direction is Y direction | The number of block when access direction is X direction | Arrangement direction of load port |
|---|---|---|---|
| 1 | 2 | 4 | None |
| 2 | 4 | 4 | Y direction |
| 3 | 4 | 4 | None |
| ... | ... | ... | ... |
| N | 2 | 2 | X direction |

TRANSPORT SYSTEM AND GRID SYSTEM

TECHNICAL FIELD

This disclosure relates to a transport system and a grid system.

BACKGROUND

A transport system including a plurality of transport vehicles, and a controller that controls the plurality of transport vehicles is known. As this type of technology, for example, WO 2019/101725 discloses a system in that a vehicle transports a container on a grid-patterned travel path. In the system disclosed in WO '725, when traveling, the vehicle occupies two square spaces of the travel path. When transferring a container, a beam rotates so that three square spaces of the travel path are occupied. Other vehicles are not allowed to enter the occupied area (blocking zone).

With the further widespread use of the above-described system in recent years, it is desired to improve the transport efficiency of transport vehicles.

SUMMARY

We thus provide a transport system and a grid system that are capable of improving a transport efficiency of transport vehicle.

Our transport system includes a plurality of transport vehicles and a controller that controls the plurality of transport vehicles. The transport vehicle includes a travel unit that makes the transport vehicle travel and a transfer section that moves horizontally to the travel unit and transfers an article from/to a placement table. When the transport vehicle transfers an article from/to the placement table (at the time of a transfer), the controller performs a blocking control to prohibit transport vehicles other than the transport vehicle from entering a blocking zone corresponding to an area occupied by the transport vehicle at the time of the article transfer in a plan view. When transferring an article from/to the placement table, the transport vehicle travels along an access route to the placement table in a first direction. An area of the blocking zone when the transport vehicle accesses to the placement table in the first direction is equal to or less than an area of the blocking zone when the transport vehicle accesses to the placement table in a second direction different from the first direction.

An area of the blocking zone can be suppressed to become larger when the transport vehicle transfers an article, thereby not interfering with entry of other transport vehicles. As a result, a transport efficiency of transport vehicle can be improved.

The transport vehicle may be movably provided along a travel path arranged in a grid pattern in a plan view. The first direction is perpendicular to the second direction, and the blocking zone is defined by a cell corresponding to a square space formed by a rail. A size of an area of the blocking zone may correspond to the number of cells that define the blocking zone. In such a configuration, in the system in which a transport vehicle travels along the travel path arranged in a grid pattern in a plan view, a transport efficiency of transport vehicle can be improved.

The travel path may be a rail extending horizontally and being suspended, and the travel unit may include a travel wheel that rolls on the rail, and the transfer section may include an article holder that holds an article below the rail. In a so-called grid system thus configured, a transport efficiency of transport vehicle can be improved.

The controller may memorize a map in which a plurality of the placement tables and information on the area of the blocking zone are associated with each other. The information is defined for each of a plurality of access directions toward the placement table. Using this map, the controller may determine an access direction that minimizes the area of the blocking zone as the first direction, thereby minimizing efficiently the area of the blocking zone at the time of the article transfer.

After determining the placement table to be accessed by the transport vehicle, the controller may calculate information on an area of the blocking zone for each of the plurality of access directions toward the placement table. On the basis of the calculated information, the controller may determine the access direction that minimizes the area of the blocking zone as the first direction. With this configuration, every time the transfer vehicle accesses to the transfer table, the information is calculated and the first direction is determined. Therefore, even if the situation occurs such that traveling environment of the transport vehicle is temporarily changed for some reason, an area of the blocking zone can be surely minimized depending on the situation at the time of an article transfer.

The transfer section of the transport vehicle may move relative to the travel unit in the direction perpendicular to the travel direction of the transport vehicle within horizontal plane. An area of the blocking zone when the transport vehicle accesses to the placement table in the first direction is smaller than an area of the blocking zone when the transport vehicle accesses to the placement table in the second direction. When the transport vehicle accesses to the placement table in the first direction, the transfer section may not protrude from the travel unit in a plan view at the time of an article transfer. When the transport vehicle accesses to the placement table in the second direction, the transfer section may protrude from the travel unit in a plan view at the time of an article transfer. In the transport system thus configured, a transport efficiency of transport vehicle can be improved.

A plurality of placement tables including the placement table may be arranged in parallel in a predetermined arrangement direction. An area of the blocking zone when the transport vehicle accesses to the placement table in the first direction is equal to an area of the blocking zone when the transport vehicle accesses to the placement table in the second direction and the first direction may be more parallel to the predetermined arrangement direction than the second direction. In this configuration, the priority of an arrangement direction of the placement table for an access of the transport vehicle toward the placement table can be raised. Therefore, for example, the transport vehicle can move an article smoothly between the placement tables arranged in parallel.

When there is no predetermined arrangement direction, the arrival time required until the transport vehicle accesses to the placement table in the first direction and arrives at a position that allows the transport vehicle to transfer an article from/to the placement table may be shorter than the arrival time required until the transport vehicle accesses to the placement table in the second direction and arrives at a position that allows the transport vehicle to transfer an article from/to the placement table. In this configuration, the priority of the arrival time of the transport vehicle for access of the transport vehicle to the placement table can be increased.

An area of the blocking zone when the transport vehicle accesses to the placement table in the first direction may be equal to an area of the blocking zone when the transport vehicle accesses to the placement table in the second direction. The arrival time required until the transport vehicle accesses to the placement table in the first direction and arrives at a position that allows the transport vehicle to transfer an article from/to the placement table is shorter than the arrival time required until the transport vehicle accesses to the placement table in the second direction and arrives at a position that allows the transport vehicle to transfer an article from/to the placement table. In such a configuration, for access of the transport vehicle to the placement table, the priority of the arrival time can be increased.

The arrival time required until the transport vehicle accesses to the placement table in the first direction arrives at a position that allows the transport vehicle to transfer an article from/to the placement table may be longer than the arrival time required until the transport vehicle accesses to the placement table in the second direction and arrives at a position that allows the transport vehicle to transfer an article from/to the placement table. Therefore, although the arrival time is longer, the transport vehicle can access to the placement table so as to make an area of the blocking zone smaller at the time of article transfer.

The controller may transmit a command to travel along the route to a transport vehicle of which the arrival time required until the transport vehicle accesses to the placement table in the first direction and arrives at a position that allows the transport vehicle to transfer an article from/to the placement table is the shortest of a plurality of transport vehicles. This enables a transport efficiency to be improved.

Our grid system includes a rail extending horizontally and arranged in a grid pattern, a plurality of transport vehicles capable of traveling along the rail, and a controller that controls the plurality of transport vehicles. The transport vehicle includes a travel unit that makes the transport vehicle travel and a transfer section that moves relative to the travel unit in the direction perpendicular to the travel direction of the transport vehicle within horizontal plane to transfer an article from/to the placement table. When the transport vehicle transfers an article from/to the placement table, the controller performs a blocking control to prohibit transport vehicles other than the transport vehicle from entering a blocking zone. The blocking zone is occupied by the transport vehicle in a plan view when the article is transferred and defined by a cell corresponding to a square space formed by the rail. When there is a first direction which is an access direction that prevents the transfer section from protruding to other cells adjacent to the cells occupied by the travel unit when the transfer section is moved so as to transfer an article, the transport vehicle accesses to the placement table in the first direction.

In the above grid system, when a transport vehicle transfers an article, the number of cells of blocking zone can be suppressed to become larger, thereby not interfering with entry of other transport vehicles. As a result, a transport efficiency of the transport vehicle V can be improved.

Our transport system and grid system are thus capable of improving a transport efficiency of transport vehicle.

BRIEF DESCRIPTION OF THE DRAWINGS

FIG. 5($a$) is a top view showing an example of blocking zone of a blocking control.

FIG. 5($b$) is a top view showing another example of blocking zone of the blocking control.

FIG. 5($c$) is a top view showing still another example of blocking zone of the blocking control.

FIG. 7($a$) is a top view showing an example of a blocking zone when an access direction is Y direction.

FIG. 7($b$) is a top view showing a continuation of FIG. 7($a$).

FIG. 10 is a view showing an example of map.

REFERENCE SIGNS LIST

Figure 1:
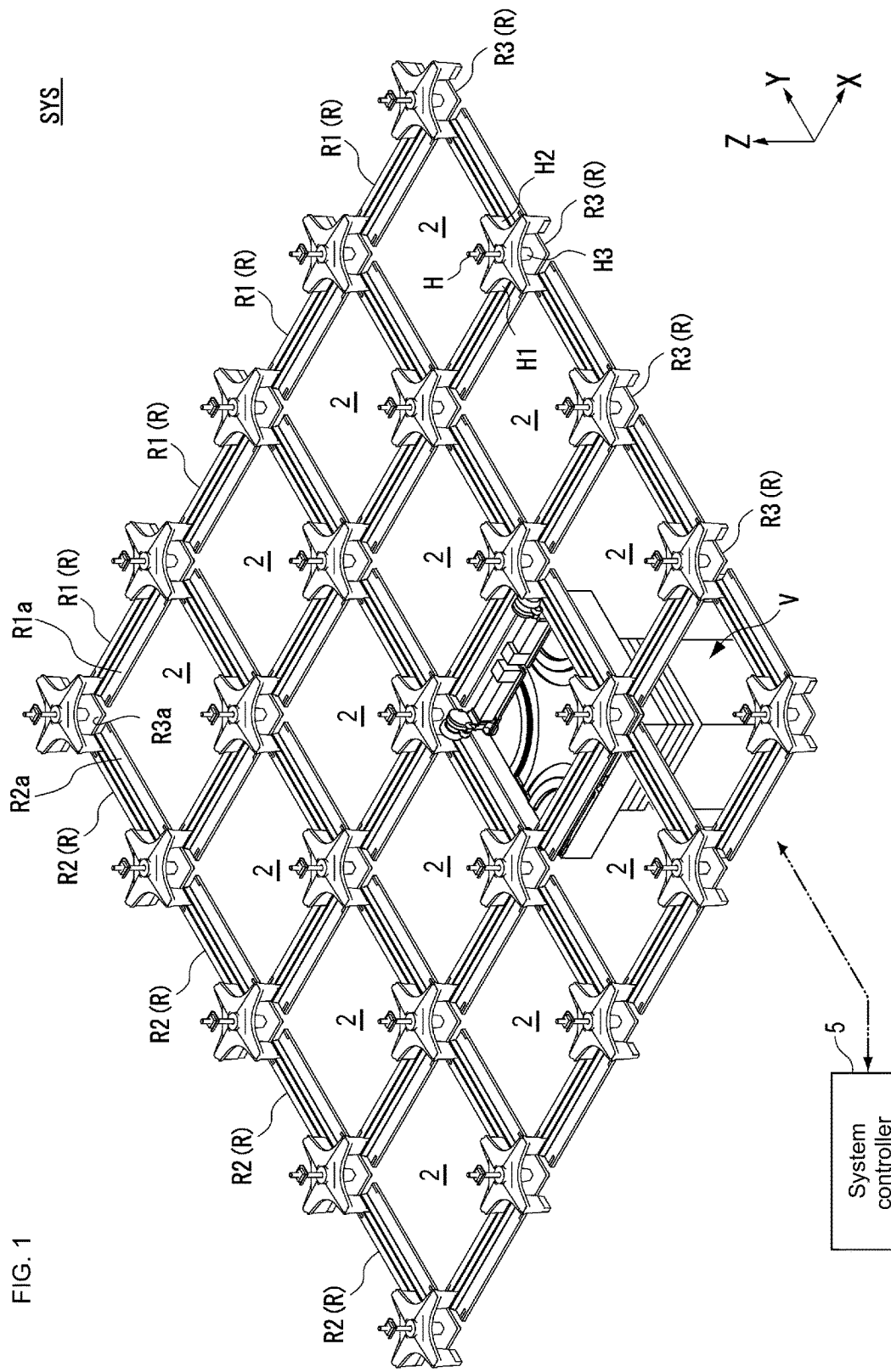
FIG. 1 is a perspective view of a transport system according to a first preferred example.

2: Grid cell (cell)
3: Blocking zone
5: System controller (controller)
13: Article holder
18: Transfer unit (transfer section)
20: Travel unit
21: Travel wheel
M: Article
MP: Map
P: Load port (placement table)
R: grid-patterned rail (travel path)
SYS: Transport system (grid system)
V, V1, V2, Vn: Transport vehicle

DETAILED DESCRIPTION

Hereinafter, with reference to the drawings, preferred examples of our transport and grid systems will be now described. For detailed explanation of the examples, the drawings are partially enlarged or highlighted to change their scale in an appropriate manner. Directions in the following drawings will be now described using XYZ coordinate system. In this XYZ coordinate system, a plane horizontal to a horizontal surface is referred to as XY plane. A direction along this XY plane is represented as X direction and a direction perpendicular to the X direction is represented as Y direction. A direction perpendicular to the XY plane is represented as Z direction. For each of X direction, Y direction, and Z direction in the drawings, a direction indicated by an arrow is +direction, and the direction indicated by the arrow and the opposite direction are deemed to be one direction. The direction to turn around a vertical axis or a Z axis is represented as θZ direction.

First Example

Figure 2:
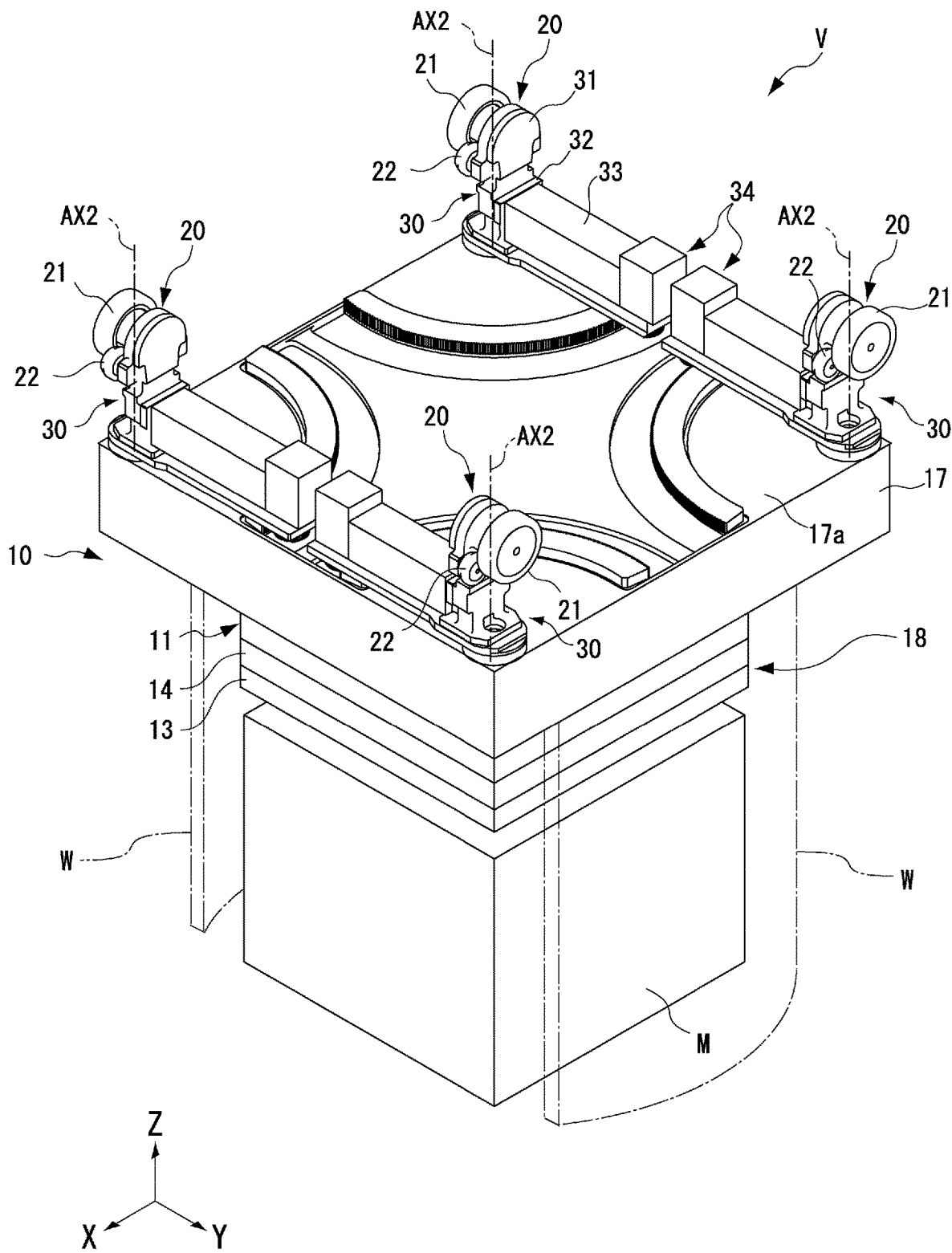
FIG. 2 is a perspective view showing an example of a transport vehicle.
Figure 3:
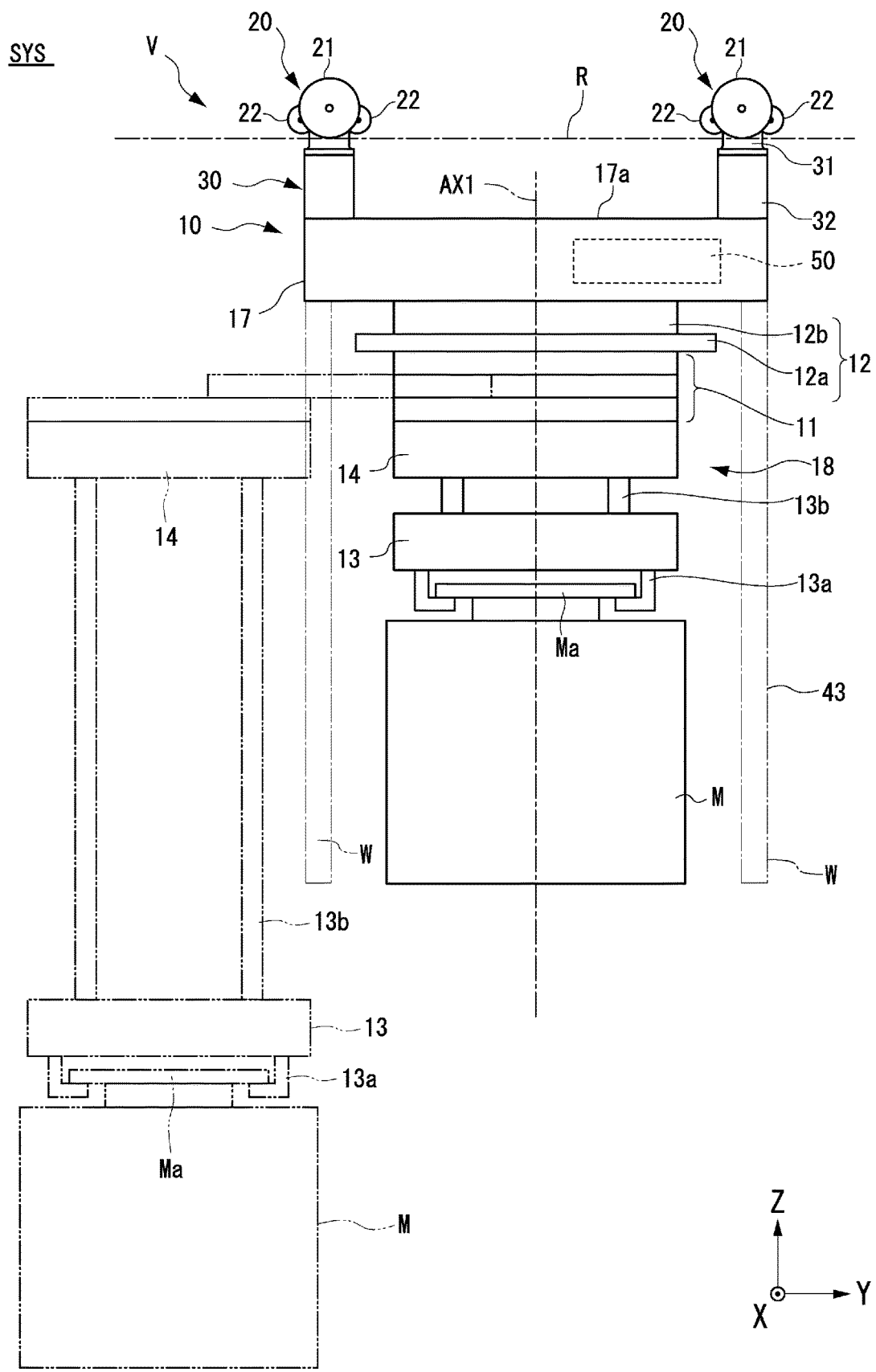
FIG. 3 is a side view showing an example of the transport vehicle.
Figure 4:
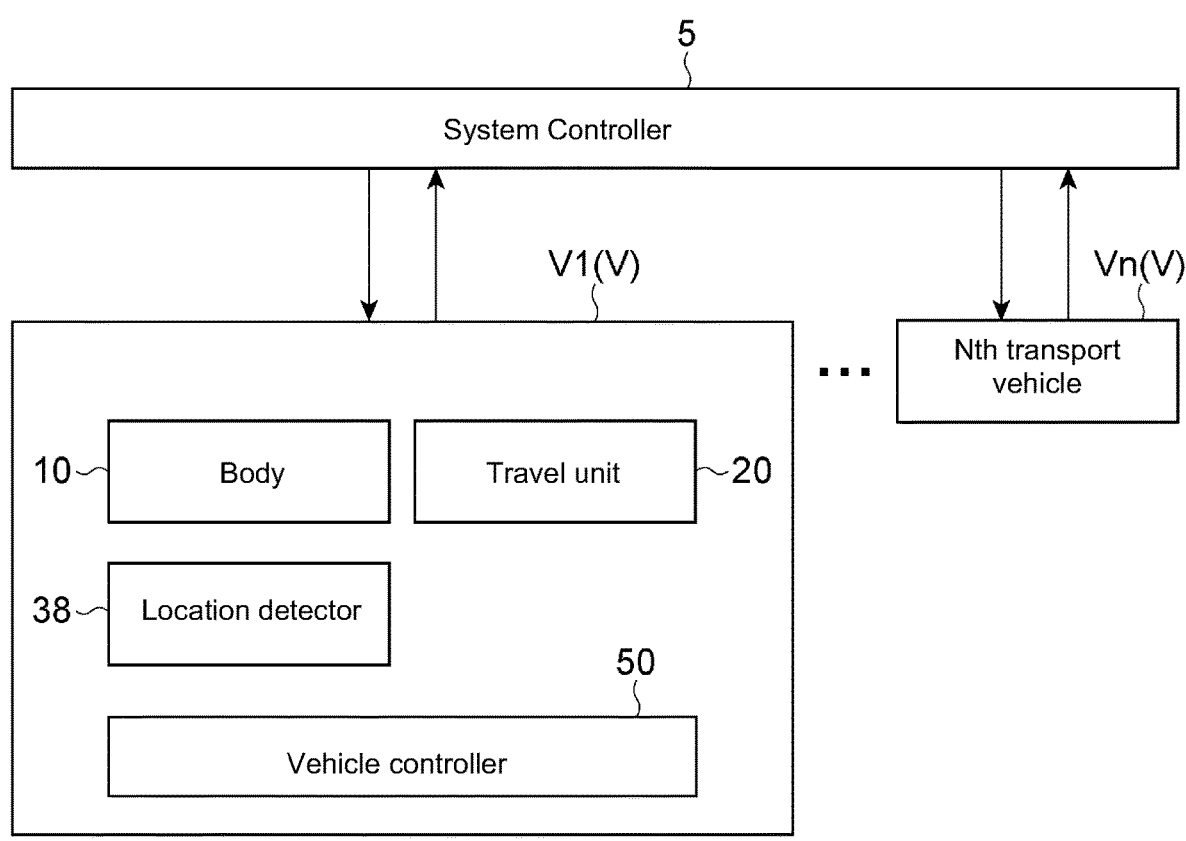
FIG. 4 is block diagram showing the transport system.

FIG. 1 is a perspective view showing a transport system SYS according to a preferred example. FIG. 2 is a perspective view of a transport vehicle V used in the transport system SYS of FIG. 1. FIG. 3 is a side view showing the transport vehicle V of FIG. 2. FIG. 4 is a block diagram showing the transport system SYS of FIG. 1.

The transport system SYS is a grid system intended to transport an article M by the vehicle V, e.g., in a clean room in semiconductor manufacturing factories. The transport system SYS includes a first transport vehicle V1 to an nth transport vehicle Vn (hereinafter, collectively transport vehicle V) (see FIG. 4) and a system controller 5 that controls a plurality of transport vehicles V. An example that the transport vehicle V is an overhead transport vehicle will be described. The transport vehicle V moves along a rail R of the transport system SYS. The rail R is a travel path of the transport vehicle V. The transport vehicle V moves along a rail R of the transport system SYS to transport an article M such as FOUP accommodating semiconductor wafers or a reticle Pod accommodating reticles. The transport vehicle may be referred to as a vehicle V.

The rail R is laid on or around a ceiling of a facility such as a clean room. The rail R is provided close to, e.g., a processor or a stocker (automated warehouse). The processor such as exposure apparatus, a coater-developer, film forming apparatus, or etching equipment performs a variety of processes on semiconductor wafers contained in a container transported by the vehicle V. The stocker stores the articles M transported by the transport vehicle V. The rail R, which is an example of form of a travel path, is provided in a grid pattern in a plan view. The rail R extends horizontally and is suspended. The rail R includes a plurality of first rails R1, a plurality of second rail R2, and a plurality of intersections R3. Hereinafter, the rail R is referred to as a grid-patterned rail R.

The first rails R1 extend along X direction. The second rails R2 extend along Y direction. The grid-patterned rail R is formed with the plurality of first rails R1 and the plurality of second rail R2 in a grid pattern in a plan view. The grid-patterned rail R forms a plurality of square spaces with the first rails R1 and the second rails R2. The intersection R3 is arranged at the position where the first rail R1 and the second rail R2 intersect with each other. The intersection R3 is adjacent to the first rail R1 in X direction and to the second rail R2 in Y direction. The intersection R3 is a connection rail configured to connect the first rail R1 and the second rail R2, to connect between the first rails R1, and between the second rails R2. The intersection R3 is used for travel of the transport vehicle V along the first rail R1, for travel of the transport vehicle V along the second rail R2, for travel of the transport vehicle V from the first rail R1 to the second rail R2, and for travel of the transport vehicle V from the second rail R2 to the first rail R1.

The grid-patterned rail R is provided such that the plurality of first rails R1 and the plurality of second rails R2 are perpendicular to each other so that a plurality of grid cells (cells) 2 are adjacent to each other in a plan view. Each of the grid cells 2 corresponding to a square space is a rectangular area surrounded by two first rails R1 adjacent to each other in Y direction and two second rails R2 adjacent to each other in a plan view. FIG. 1 shows a part of the grid-patterned rail. The pattern shown in FIG. 1 continuously spreads in X direction and Y direction to form the grid-patterned rail R.

The first rail R1, the second rail R2, and the intersection R3 are suspended from a ceiling (not illustrated) by a suspending member H as shown in FIG. 1. The suspending member H includes a first part H1 to suspend the first rail R1, a second part H2 to suspend the second rail R2, and a third part H3 to suspend the intersection R3. The first part H1 and the second part H2 are each attached to two positions of both sides of the third part H3.

The first rail R1, the second rail R2, and the intersection R3 include traveling surfaces R1a, R2a, and R3a on which a travel wheel 21 (described later) of the transport vehicle V travels, respectively. A gap is each formed between the first rail R1 and the intersection R3 and between the second rail R2 and the intersection R3. When the transport vehicle V travels on the first rail R1 and crosses the second rail R2 or travels on the second rail R2 and crosses the first rail R1, a coupler 30 (described later) which is a part of the transport vehicle V passes through the gap between the first rail R1 and the third intersection R3 and the gap between the second rail R2 and the intersection R3. Accordingly, the gap between the first rail R1 and the intersection R3 and the gap between the second rail R2 and the intersection R3 are wide enough for the coupler 30 to pass through. The first rail R1, the second rail R2 and the intersection R3 are provided along the same horizontal surface. In this example, the traveling surface R1a of the first rail R1, the traveling surface R2a of the second rail R2, and the traveling surface R3a of the intersection R3 are disposed on the same horizontal surface.

The first rail R1 is a one-way rail. The traveling directions of a pair of the first rails R1 adjacent to each other are different from each other. A transport vehicle travels on one of the pair of the adjacent rails R1 in one of −X direction and +X direction and the transport vehicle travels on the other of the pair of the adjacent rails R1 in the other of −X direction and +X direction. The second rail R2 is a one-way rail. The traveling directions of a pair of the second rails R2 adjacent to each other are different from each other. The transport vehicle travels on one of the pair of the adjacent rails R2 in one of −Y direction and +Y direction and the transport vehicle travels on the other of the pair of the adjacent first rails R1 in the other of −Y direction and +Y direction.

The transport system SYS is provided with a communication system (not illustrated) used for communication of the transport vehicle V and a system controller 5. The transport vehicle V and a system controller 5 are communicably connected to each other via each communication system.

The configuration of the transport vehicle V will be now described. As shown in FIGS. 2 to 4, the transport vehicle V is provided movably on the grid-patterned rail R. The transport vehicle V includes a body 10, a travel unit 20, coupler 30, and a vehicle controller 50.

The body 10 is provided below the grid-patterned rail R (in −Z direction). The body 10 is formed, for example, in a rectangular shape in a plan view. The body 10 is formed to fit in size within one grid cell 2 as shown in FIG. 1 of the grid-patterned rail R in a plan view. This ensures an enough space for the transport vehicle V to pass by another transport vehicle V traveling on the adjacent first rail R1 or the second rail R2. The body 10 includes an upper unit 17 and a transfer unit (transfer section) 18. The upper unit 17 is suspended from the travel unit 20 via the coupler 30. The upper unit 17 is, for example, in a rectangular shape in a plan view and includes four corners on the top surface 17a.

The body 10 includes a travel wheel 21, the coupler 30, and a direction change mechanism 34 at each of the four corners thereof. With this configuration, the body 10 can be stably suspended by the travel wheels 21 arranged at the four corners of the body 10 and the body 10 can stably travel.

A transfer unit 18 moves horizontally to the travel unit 20 to transfer an article from/to a load port (placement table) P. The transfer unit 18 is provided below the upper unit 17. The transfer unit 18 is capable of rotating around a rotation axis AX1 in Z direction. The transfer unit 18 includes an article holder 13 that holds an article M, an elevating driver 14 to move the article holder 13 in the vertical direction, a sliding mechanism 11 to slide the elevating driver 14 horizontally, and a rotation unit 12 that holds the sliding mechanism 11. The load port P is a destination or a pick-up station of article transfer as well as a location from/to which the transport vehicle V transfers an article.

The article holder 13 suspends and holds the article M by gripping a flange portion Ma of the article M. The article holder 13 is, for example, a chuck including a claw 13a movable horizontally. The claw 13a inserts into below the flange portion Ma of the article M and lifts up the article holder 13 to hold the article M. The article holder 13 is connected to a suspending member 13b such as a wire or a belt.

The elevating driver 14 such as a hoist, reels out the suspending member 13b to lower the article holder 13 and reels in the suspending member 13b to lift up the article holder 13. The elevating driver 14 is controlled by the vehicle controller 50 to move the article holder 13 up or down at the predetermined speed. Further, the elevating driver 14 is controlled by the vehicle controller 50 to hold the article holder 13 at the targeted level.

The sliding mechanism 11 includes, for example, a plurality of movable plates stacked in Z direction. The elevating driver 14 is attached to the bottommost movable plate. In the sliding mechanism 11, the movable plates moves in the direction perpendicular to the traveling direction of the transport vehicle V within a horizontal surface and the elevating driver 14 attached to the bottommost movable plates and the article holder 13 slide out in the direction perpendicular to the traveling direction of the transport vehicle V.

The rotation unit 12 is provided between the sliding mechanism 11 and the upper unit 17. The rotation unit 12 includes a rotating member 12a and a rotating driving portion 12b. The rotating member 12a is provided rotatably around the axis in Z direction. The rotating member 12a supports the sliding mechanism 11. The rotation driving portion 12b such as an electric motor drives the rotating member 12a to rotate around the rotation axis AX1. The rotation unit 12 is capable of rotating the rotating member 12a by the driving force from the rotation driving portion 12b and rotating the sliding mechanism 11 (elevating driver 14 and article holder 13) around the rotation axis AX1. The transport vehicle V is capable of transferring the article M from/to the load port P by using the transfer unit 18.

As shown in FIGS. 2 and 3, a cover W may be provided at the transport vehicle V to surround the transfer unit 18 and the article M held by the transfer unit 18. The cover W is in a cylindrical shape with the bottom edge opened and has a cut-out for a protrusion of the movable plates of the sliding mechanism 11. The cover W, of which the top edge is attached to the rotating member 12a of the rotation unit 12, rotates around the rotation axis AX1 along with the rotation of the rotating member 12a.

The travel unit 20 includes a travel wheel 21 and auxiliary wheels 22. The travel wheel 21 is arranged at each of four corners of the top surface 17a of the upper unit 17 (body 10). The travel wheel 21 is attached to an axle provided on the coupler 30. The travel wheel 21 is rotationally driven by the driving force of a traveling driver 33. The travel wheel 21 rolls on the grid-patterned rail R. The travel wheel 21 rolls on the traveling surface R1a, R2a, and R3a of the first rail R1, the second rail R2, and the intersection R3 to cause the vehicle V to travel. All of four travel wheels 21 are rotationally driven by the driving force of the traveling driver 33, but not limited to. A part of the four travel wheels 21 may be rotationally driven.

The travel wheel 21 is provided pivotably around a pivot AX2 in θZ direction. The travel wheel 21 turns in θZ direction by the direction change mechanism 34 (described later), which enables the vehicle V to change its traveling direction. Each of the auxiliary wheels 22 is disposed at each of front and rear of the travel wheel 21 in the traveling direction. Similar to the travel wheel 21, the auxiliary wheels 22 are capable of rotating around the parallel or substantially parallel axle along XY plane. The auxiliary wheels 22 are provided such that the bottom edges thereof are higher than the bottom edge of the travel wheel 21. Accordingly, while the travel wheel 21 travels on the traveling surface R1a, R2a, or R3a, the auxiliary wheels 22 do not contact with the traveling surface R1a, R2a, or R3a. When the travel wheel 21 passes through the gap between the first rail R1 and the intersection R3 and the gap between the second rail R2 and the intersection R3, the auxiliary wheels 22 contact with the traveling surface R1a, R2a, or R3a to prevent the travel wheel 21 from being caught on the gap. Two auxiliary wheels 22 are provided at each travel wheel 21, but not limited to. For example, a single auxiliary wheel 22 or no auxiliary wheel 22 may be provided at each travel wheel 21.

As shown in FIG. 2, the coupler 30 couples the upper unit 17 of the body 10 with the travel unit 20. The coupler 30 is provided at each of four corners of the top surface 17a of the upper unit 17 (body 10). The body 10 is suspended from the travel unit 20 by the coupler 30 and arranged below the grid-patterned rail R. The coupler 30 includes a supporter 31 and a connector 32. The supporter 31 rotatably supports a rotation axis of the travel wheel 21 and a rotation axis of the auxiliary wheel 22. The relative position of the travel wheel 21 and the auxiliary wheel 22 is retained by the supporter 31. The supporter 31 is formed, e.g., in a plate shape having enough width to pass through the gap between the first rail R1 and the intersection R3 and the gap between the second rail R2 and the intersection R3.

The connector 32 extending downwards from the supporter 31 is coupled with the upper surface 17a of the upper unit 17 to hold the upper unit 17. The connector 32 includes a transmission mechanism, which transmits the driving force of the traveling driver 33 (described later) to the travel wheel 21. In the transmission mechanism, a chain or a belt may be used, or a gear train may be used. The connector 32 is provided pivotably around the pivot AX2 in θZ direction. The connector 32 pivots around the pivot AX2, enabling the travel wheel 21 to turn around the pivot AX2 via the supporter 31 in θZ direction.

The coupler 30 as shown in FIG. 2 is provided with the traveling driver 33 and the direction change mechanism 34. The traveling driver 33 is attached to the connector 32. The traveling driver 33 is a drive source to drive the travel wheel 21 such as an electric motor. Each of four travel wheels 21 is a driven wheel that is driven by the traveling driver 33. The four travel wheels 21 are controlled by the vehicle controller 50 to rotate at the same speed.

The direction change mechanism 34 causes the connector 32 of the coupler 30 to turn around the pivot AX2, which enables the travel wheel 21 to turn around the pivot AX2 in θZ direction. The travel wheel 21 turns around the pivot AX2 in θZ direction so that the traveling direction of the transport vehicle V can be changed from X direction to Y direction or from Y direction to X direction. The direction change mechanism 34 pivot, causing each of the travel wheel 21 and the auxiliary wheels 22 disposed at each of four corners of the top surface 17a to turn in the range of 90 degrees centered on the pivot AX2 in θZ direction. The vehicle controller 50 controls how the direction change mechanism 34 drives. The travel wheel 21 and the auxiliary wheels 22 pivot so that the rail with which the travel wheel 21 is in contact is changed from one of the first rail R1 and the second rail R2 to the other. Therefore, traveling direction of the transport vehicle V can be switched between X direction and Y direction.

The transport vehicle V includes a location detector 38 that detects locational information as shown in FIG. 4. The location detector 38 detects the actual location of the transport vehicle V by detecting a location marker (not illustrated) showing locational information. The location detector 38 detects the location marker in a non-contact manner. The location marker is provided for each grid cell 2 of the grid-pattern rail R.

The vehicle controller 50 controls the transport vehicle V as a whole. The vehicle controller 50 is a computer including CPU (Central Processing Unit), ROM (Read Only Memory) and RAM (Random Access Memory) or the like. For example, the vehicle controller 50 may be configured as software in which a program stored in ROM is loaded on RAM and executed by CPU. Also, the vehicle controller 50 may be configured as a hardware such as electric circuit. The transport controller 50 may be made up of a single device or a plurality of devices. If it is made up of the plurality of devices, the devices are connected through a communication network such as the Internet or Intranet so that one transport controller 50 is logically established. The transport controller 50 may be provided at the body 10 as shown in FIG. 3, but may be provided outside the body 10.

The transport controller 50 controls travel of the transport vehicle V on the basis of a transport command. The transport controller 50 controls travel of the transport vehicle V by controlling a traveling driver 33, the direction change mechanism 34 or the like. The vehicle controller 50 controls, e.g., the travel speed, performance related to stoppage, and performance related to direction change. The vehicle controller 50 controls the transport vehicle V not to enter a blocking zone (described later) of other transport vehicles V.

The vehicle controller 50 controls transfer operations of the transport vehicle V on the basis of the transport command. The vehicle controller 50 controls transfer operations of the transport vehicle V by controlling the transfer unit 18. The vehicle controller 50 controls a pick-up operation to grip an article M located on a predetermined load port P and an unloading operation to unload the article M being held onto a predetermined load port P. The vehicle controller 50 creates and updates status information (not illustrated) periodically. The status information is stored in a memory 51. The vehicle controller 50 transmits the status information to the system controller 5. The status information is, e.g., actual location information of the transport vehicle V, information showing actual status of the transport vehicle V such as normal or abnormal, information related to status of execution (executing, completed, failed to execute) by the transport vehicle V according to various commands such as transport command. At the time of transferring the article M, the vehicle controller 50 transmits an area occupancy request to seek permission to occupy a blocking zone (described later) to the system controller 5. After transfer of the article M is completed, the vehicle controller 50 transmits an area release request for a release of the occupied area to the system controller 5.

The system controller 5 is a computer including CPU (Central Processing Unit), ROM (Read Only Memory) and RAM (Random Access Memory) or the like. For example, the system controller 5 may be configured as software of which a program stored in ROM is loaded on RAM and executed by CPU. Also, the system controller 5 may be configured as a hardware such as electric circuit. The system controller 5 may be made up of a single device or a plurality of devices. If it is made up of the plurality of devices, the devices are connected through a communication network such as the Internet or Intranet so that one system controller 5 is logically established.

The system controller 5 selects any of a plurality of the transport vehicles V capable of transporting the article M and allocates the transport command to the selected vehicle V. The transport command includes a travel command that makes the transport vehicle V travel to the load port P, a grip command that makes the vehicle V grip the article M located on the load port P, and an unloading command that makes the vehicle V unload the article M being held onto the load port P.

When the transport vehicle V transfers an article M from/to the load port P, the system controller 5 performs a blocking control which is an exclusion control to prohibit transport vehicles V other than the transport vehicle V from entering a blocking zone. Therefore, the transport vehicles V prevented from entering the blocking zone unpermitted for occupancy, for example, wait in front of the blocking zone. For example, responding to the area occupancy permission request from the vehicle controller 50, the system controller 5 starts the blocking control and grants the transport vehicles V a permission to enter the blocking zone. For example, responding to the area release request from the vehicle controller 50, the system controller 5 releases the blocking control (occupancy of the blocking zone).

The blocking zone will be now described in detail. As shown in FIG. 5, a blocking zone 3 corresponds to an area occupied by the transport vehicle V at the time of transferring an article M in a plan view. The blocking zone 3 is defined by a grid cell 2 corresponding to a square space formed by grid-patterned rails R. An area of the blocking zone 3 depends on the number of the grid cells 2 that defines the blocking zone 3. An area of the blocking zone 3 is an area of the blocking zone 3 in a plan view. The blocking zones 3 can be configured in three patterns.

For example, as the example shown in FIG. 5(a), when the transport vehicle V travels in Y direction to transfer an article, the transfer unit 18 protrudes from the travel unit 20 in X direction in a plan view and enters the grid cells 2 adjust to the grid cells 2 where the travel unit 20 is located. In this example, the blocking zone 3 is formed with four grid cells 2 surrounding the travel unit 20 and transfer unit 18 in a plan view. The number of blocks (information on the area) of the blocking zone 3 is '4' in units of grid cell 2. The direction of a triangle on the transport vehicle V shown in FIG. 5(a) indicates the traveling direction of the transport vehicle. The same applies hereinafter.

For example, as shown in FIG. 5(b), when the transport vehicle V travels in Y direction to transfer an article, the travel unit 20 is located crossing two grid cells 2 adjacent to each other in Y direction in a plan view. At the time of transfer, the transfer unit 18 does not protrude from the travel unit 20 in a plan view. Hence, the blocking zone 3 is formed with two grid cells 2 in a plan view. The number of blocks of the blocking zone 3 is '2' in units of grid cell 2.

For example, as shown in FIG. 5(c), when the transport vehicle V travels in Y direction to transfer an article, the travel unit 20 is located on a grid cell 2 in a plan view. At the time of transfer, the transfer unit 18 does not protrude from the travel unit 20 in a plan view. In this example, the blocking zone 3 is formed with one grid cell 2 in a plan view. The number of blocks of the blocking zone 3 is '1' in units of grid cell 2.

The number of blocks of the blocking zone 3 changes depending on the relation between the location of center of the load port P ('load port P') and an access direction to the load port P. The access direction to the load port P ('access direction') is a traveling direction of the transport vehicle V accessing to (entering) the grid cell 2 where the load port P is located at the time of transferring to the load port P. The access direction on the grid-patterned rail R is either X direction or Y direction.

Figure 6:
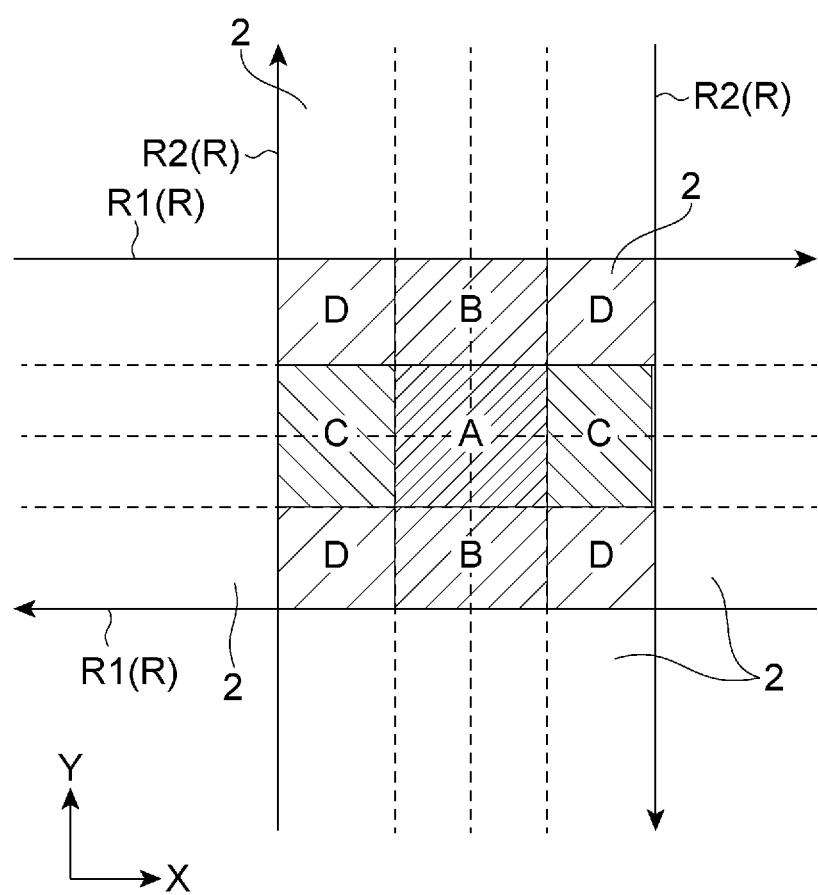
FIG. 6 is a top view showing each area defined by a grid cell.

The relation between the access direction and the blocking zone 3 will be now described. As shown in FIG. 6, with respect to the location where the load port P as shown in FIG. 7 is located, one grid cell 2 is defined into four zones of a zone A, a zone B, a zone C, and a zone D in a plan view.

The zone A is a rectangular area in the center of the grid cell 2. The probability that the load port P is located at the zone A is, for example, 16%, which is lower than one that load port P is located at the zones B to D. The probability that the load port P is located on a zone is proportional to the area of the zone. When the load port P is located at the zone A and the access direction is Y direction, the number of blocks of blocking zone 3 is '2'. When the load port P is located at the zone A and the access direction is X direction, the number of blocks of blocking zones 3 is '2' as with the Y direction.

The zone B is a rectangular zone adjacent to one or the other side of the zone A in Y direction in the grid cell 2. The probability that the load port P is located at the zone B is, for example, 24%, which is lower than the probability that the load port P is located at the zone D, equal to the probability that the load port P is located at the zone C, and higher than the probability that the load port P is located at the zone A. When the load port is located at the zone B and the access direction is Y direction, the number of blocks of blocking zone 3 is '2'. When the load port P is located at the zone B and the access direction is X direction, the number of block zones 3 is '4', which is more than that when the access direction is Y direction.

The zone C is a rectangular area adjacent to one or the other side of the zone A in X direction in the grid cell 2. The probability that the load port P is located at the zone C is, for example, 24%, which is lower than the probability that the load port P is located at the zone D, equal to the probability that the load port P is located at the zone B, and higher than the probability that the load port P is located at the zone A. When the load port is located at the zone C and the access direction is Y direction, the number of blocks of blocking zone 3 is '4'. When the load port P is located at the zone C and the access direction is X direction, the number of blocks of blocking zone 3 is '2', which is less than that when the access direction is Y direction.

The zone D is a rectangular area adjacent to one or the other side of the zone C in Y direction (one or the other side of the zone B in X direction) in the grid cell 2. The probability that the load port P is located at the zone D is, for example, 36%, which is higher than the probability that the load port P is located at the zone A, B, or C. When the load port is located at the zone D and the access direction is Y direction, the number of blocks of blocking zone 3 is '4'. When the load port P is located at the zone D and the access direction is X direction, the number of blocks of blocking zone 3 is '4'.

The shape and size of the zones A to D depends on at least any of the size of the article M, the size of the a transport vehicle V, the size of the grid cell 2 (size of square space), area of the blocking zone 3, the size of the sliding mechanism 11, and the size of the transfer unit 18. The shape and size of the zones A to D is simply one example, but not limited to that example.

For example, as shown in FIG. 7(a), when the load port P is located at the zone B and the access direction is Y direction, the transport vehicle V is located such that the travel unit 20 crosses two grid cells 2 adjacent to each other in Y direction. The transport vehicle V occupies a zone 4 including these two grid cells 2. As shown in FIG. 7(b), at the time of transfer, the transfer unit 18 moves in X direction, however, the transfer unit 18 does not protrude from the travel unit 20 in a plan view. Therefore, the transport vehicle V occupies still continue to occupies the area 4 including these two grid cells 2. Accordingly, when the load port P is located at the zone B and the access direction is Y direction, the number of blocks of the blocking zone 3 is '2'.

Figure 8:
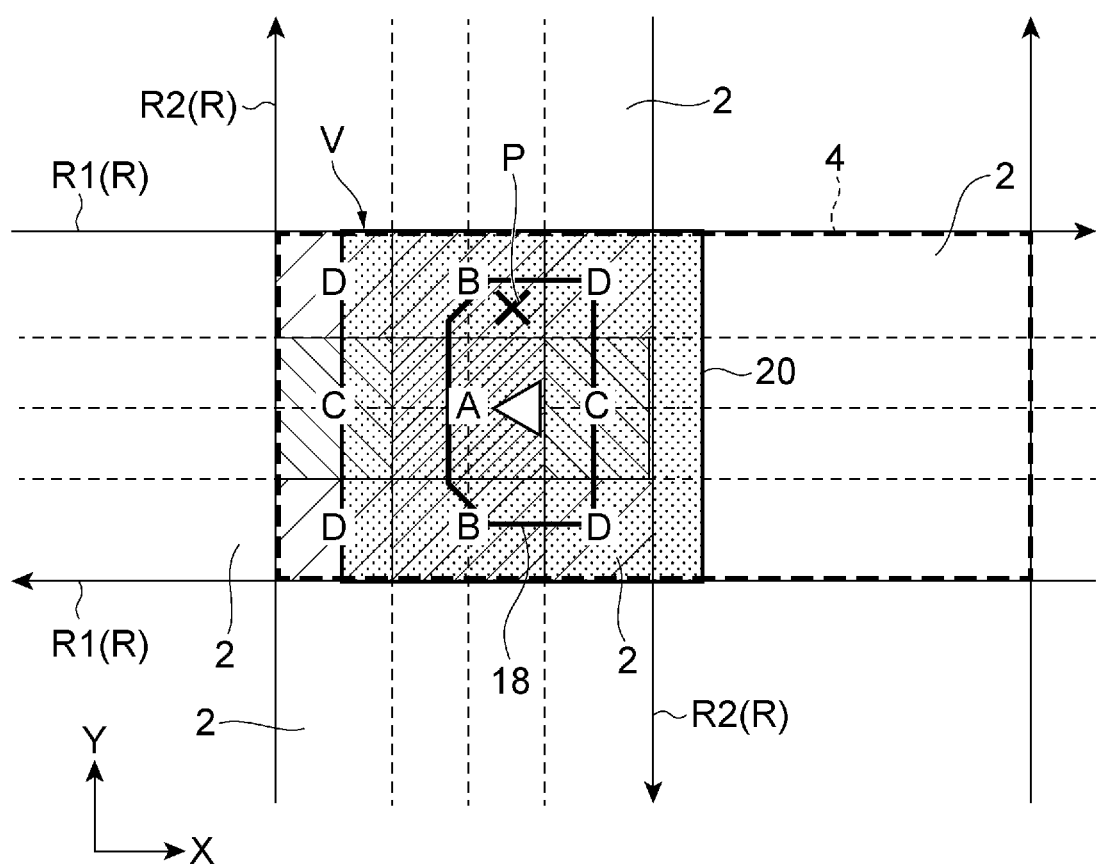
FIG. 8 is a top view showing an example of a blocking zone when an access direction is X direction.
Figure 9:
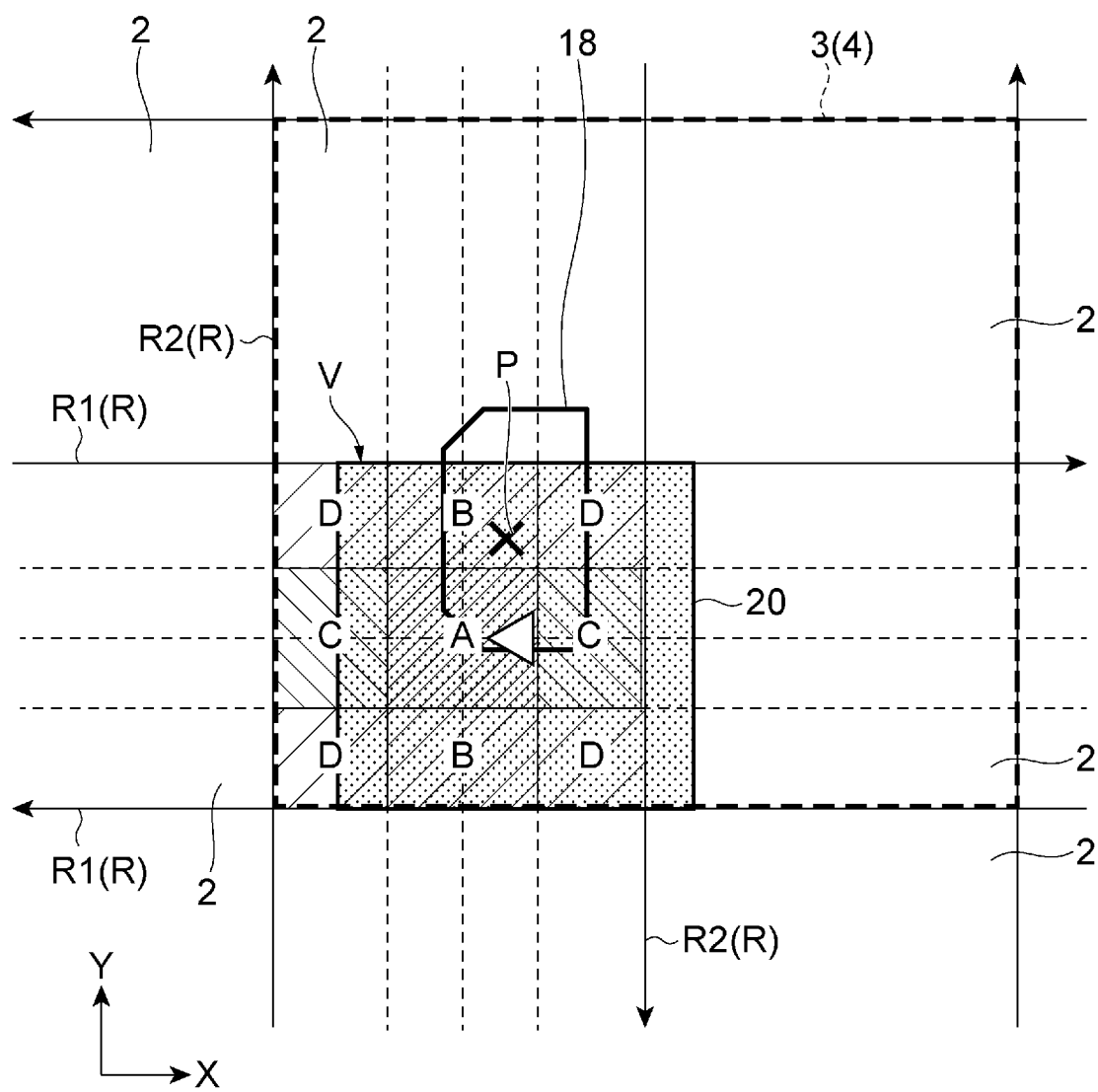
FIG. 9 is a top view showing a continuation of FIG. 8.

On the other hand, as shown in FIG. 8, when the load port is located at zone B and the access direction is X direction, the transport vehicle V is located such that the travel unit 20 crosses the two grid cells 2 adjacent to each other in X direction. The transport vehicle V occupies the area 4 including these grid cells 2. As shown in FIG. 9, at the time of transfer, the transfer unit 18 moves in X direction, and the transfer unit 18 protrudes from the travel unit 20 in Y direction in a plan view and enters the grid cells 2 adjacent to each other in Y direction. The transport vehicle V occupies the area 4 including the two grid cells 2 and other two grid cells 2 adjacent to each other in Y direction. Therefore, when the load port P is located at zone B and the access direction is X direction, the number of blocks of the blocking zone 3 is '4'. The grid cell 2 in the top right of FIG. 9, which is not physically occupied by the transport vehicle V, is adjacent to the two grid cells 2 physically occupied by the transport vehicle V. Thus, considering travel safety of the vehicle, the grid cell 2 in the top right is included in the blocking zone 3.

Returning to FIG. 4, the system controller 5 memorizes a map in which a plurality of the load ports P, information on an area of the blocking zone 3 defined for each of the plurality of the access directions, and arrangement direction of the load port P are associated with each other. For example, as shown in FIG. 10, in a map MP memorized in the system controller 5, 'the number of blocks of blocking control when access direction is Y direction', 'the number of blocks of blocking control when access direction is X direction', and 'Arrangement direction of load port P' are set for each of 'load port No.' of a plurality of load ports P.

Figure 11:
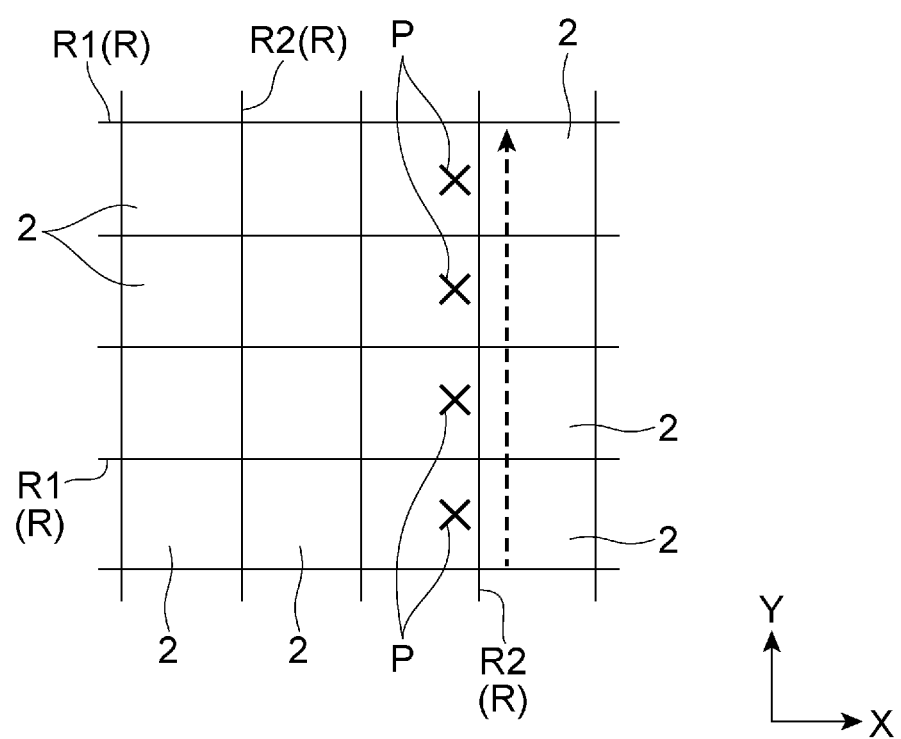
FIG. 11 is a top view showing an example of an arrangement direction of a load port.

The port No. is an identification number set for each of the plurality of load ports P. On the basis of the above-described relation between the access direction and the blocking zone 3, the number of blocks is preliminary calculated and set. The arrangement direction of the load port P (predetermined arrangement direction) is, for example, an arrangement direction of the plurality of load port P arranged in parallel at intervals less than a predetermined distance. For example, as shown in FIG. 11, for the plurality of load port P arranged in parallel in Y direction at intervals less than a predetermined distance, the arrangement direction is Y direction. For example, for the load ports P separated from each other at a predetermined distance and more, there is no arrangement direction. For example, for the load ports P arranged in parallel in a direction neither X direction nor Y direction, there is no arrangement direction. In addition to the number of blocks, the map MP may include numbers (identifier) of grid cells 2 of which the blocking zone 3 is made up.

When the transport vehicle V transfers an article M from/to the load port P, using the map MP, the system controller 5 determines an access direction, which is the direction in which the transport vehicle V accesses to the load port P. In particular, when the transport vehicle V transfers an article M from/to the load port P, using the map MP, the system controller 5 determines the access direction that minimizes the number of blocks of the blocking zone 3 (an area of the blocking zone 3) as a first direction.

If there are a plurality of access directions that minimize the number of blocks in the map MP, any of these access directions which is most appropriate to the arrangement direction of the load port P is determined as a first direction. Further, if there are a plurality of access directions that minimizes the number of blocks in the map MP as well as there is no arrangement direction of the load port P, any access direction in which the arrival time required until the transport vehicle V arrives at the position that allows the transport vehicle to transfer an article M from/to the load port P is shortest is chosen as a first direction from these access directions that minimizes the number of blocks. Hereinafter, the position that allows the transport vehicle V to transfer an article M from/to the load port P is referred to as 'transfer position' and the arrival time required until the transport vehicle V arrives at the transfer position is simply referred to as 'arrival time'. Only access directions of which the access route to the load port P is active (in other words, entry is not allowed due to cell down (cell blockage)) can be subject to the first direction determined by the system controller 5.

For example, the system controller 5 acquires the port number of the load port P to be accessed on the bases of the transport command. With reference to the map MP, the system controller 5 acquires the number of blocks associated with the acquired port number from the map MP depending on whether the access direction is X direction or Y direction. Further, with reference to the map MP, the system controller 5 acquires the arrangement direction of the load port P associated with the acquired port number. The system controller 5 determines one of x direction and Y direction, for which the number of blocks is smaller than the other as a first direction. If the number of blocks for X direction is equal to that for Y direction, one of X direction and Y direction that is more parallel to the arrangement direction of load port P than the other is determined as a first direction. If the number of blocks for X direction is equal to that for Y direction as well as there is no arrangement direction of the load port P, one of X direction and Y direction for which the arrival time is the shortest is determined as a first direction.

Then the system controller 5 generates a route to access to the load port P in the determined first direction and cause the transport vehicle V to travel along this route. As a result, the transport vehicle V travels along the route to access to the load port P in the first direction. The route is shown by, for example, a plurality of grid cells 2 to be entered. The route is generated to prevent the transport vehicle V from entering the blocking zone 3 for which the transport vehicle V is not received an occupancy permission (blocking zone 3 of other transport vehicle V).

The number of blocks (area) when the transport vehicle V accesses to the load port P in the first direction is smaller than or equal to that when the transport vehicle V accesses to the load port P in a second direction. The first direction is perpendicular to the second direction. The first direction is one of X direction and Y direction and the second direction is the other.

When the number of blocks when the first direction is the access direction is equal to that when the second direction is the access direction, the first direction is more parallel to the arrangement direction of the load port P than the second direction. When the number of blocks when the first direction is the access direction is equal to that when the second direction is the access direction and there is no arrangement direction of load port P, the arrival time required for an access of the transport vehicle V toward the load port P in the first direction is shorter than the arrival time required for an access of the transport vehicle V toward the load port P in the second direction.

When the number of blocks when the first direction is the access direction is smaller than that when the second direction is the access direction, and the access direction is the first direction, the transport unit 18 does not protrude from the travel unit 20 at the time of transfer in a plan view. When the number of blocks when the first direction is the access direction is smaller than that when the second direction is the access direction, and the access direction is the second direction, the transfer unit 18 protrudes from the travel unit 20 at the time of transfer in a plan view.

As described above, the access direction is the first direction so that the transport vehicle V can access to the load port P to prevent the transfer unit 18 from protruding to other grid cells adjacent to the grid cells 2 occupied by the travel unit 20 when the transfer unit 18 is moved at the time of transferring an article M as shown in FIG. 7(*b*). In other words, if there is the first direction which is an access direction that prevents the transfer unit 18 from protruding to other grid cells 2 at the time of transferring the article M, the transport vehicle V accesses to the load port P in the first direction. At least a part of these various controls performed by the system controller 5 may be controlled by the vehicle controller 50.

In the transport system SYS, an example that the transport vehicle V accesses to the load port P in transferring an article M will be now described.

Figure 12:
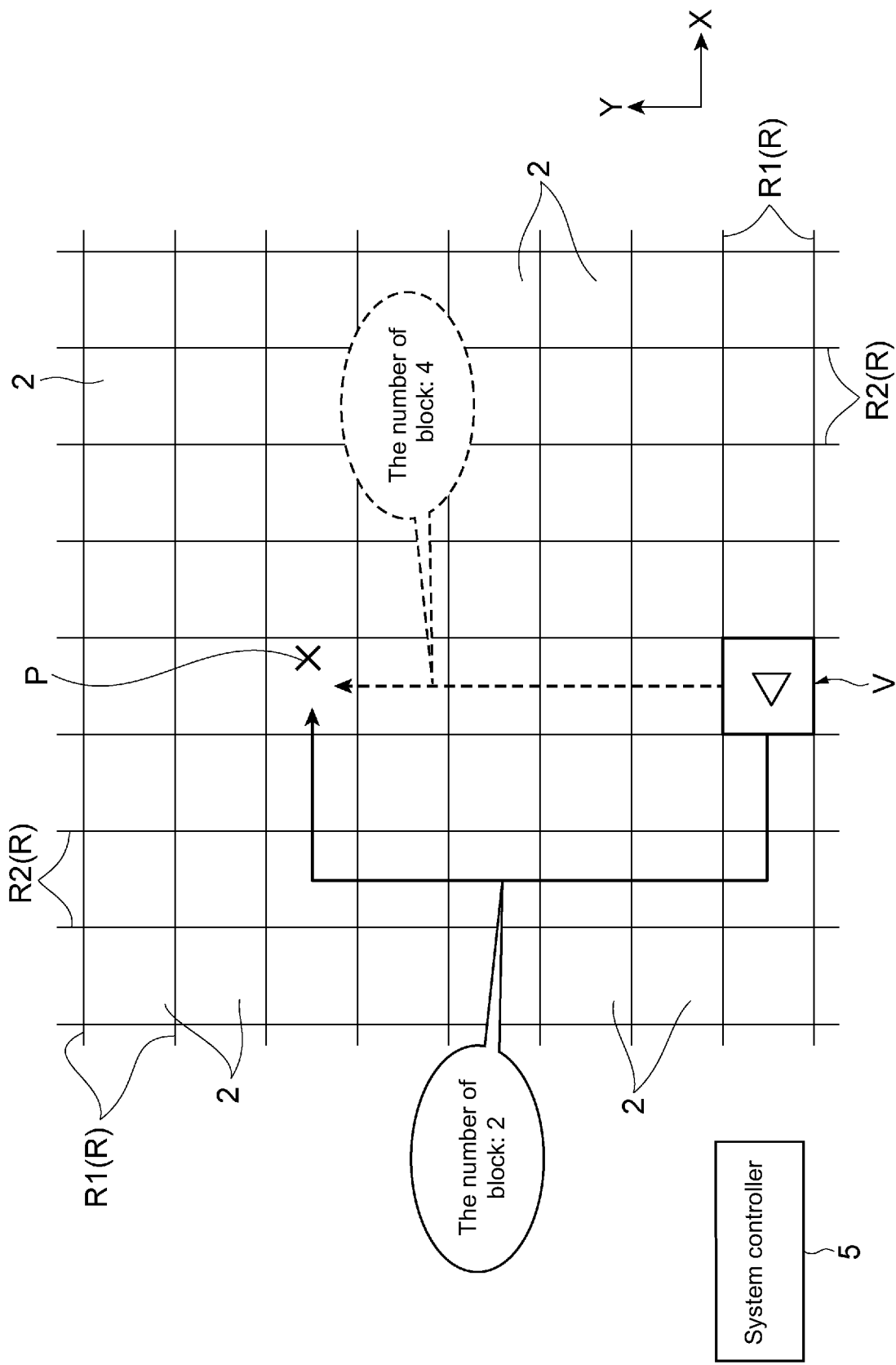
FIG. 12 is a top view explaining an example of operations of the transport system.

FIG. 12 is a top view explaining an example of operations of the transport system SYS. As shown in FIG. 12, using the map MP, the system controller 5 acquires the number of blocks when the access direction is X direction and the number of blocks when the access direction is Y direction from the port number of the load port P to be accessed. The number of blocks is 2 when the access direction is X direction and the number of blocks is 4 when the access direction is Y direction. Accordingly, the system controller 5 determines that X direction is the first direction and allocates the transport command including the travel command to travel along the route to the load port P in the first direction to the transport vehicle V.

As a result, the transport vehicle V to which the transport command is allocated travels toward the load port along the route to the load port P in the first direction. In the example shown in FIG. 12, the arrival time required for an access of the transport V toward the load port P in the first direction is longer than the arrival time required for an access of the transport V toward the load port P in the second direction.

Accordingly, in the transport system SYS, the transport vehicle V accesses to the load port P in the first direction in transferring an article M from/to the load port P. An area of the blocking zone 3 when the transport vehicle V accesses in the first direction is an area of the blocking zone 3 when the transport vehicle V accesses in the second direction or less. Therefore, in transferring an article M, the transport vehicle V can access to the load port P to prevent an area of the blocking zone 3 from becoming larger. When the transport vehicle V transfers an article M, the area of the blocking zone 3 can be suppressed to become larger, thereby not interfering with entry of other transport vehicles V. As a result, a transport efficiency of the transport vehicle V can be improved.

In the transport system SYS, the transport vehicle V is capable of traveling on the grid-patterned rail R arranged in a grid pattern in a plan view. The first direction is perpendicular to the second direction, and the blocking zone 3 is defined by a grid cell 2 corresponding to a square space formed with the grid-patterned rails R. The area of the blocking zone 3 depends on the number of the grid cells 2 by which the blocking zone 3 is defined. Therefore, in the system in which the transport vehicle V travels on the grid-patterned rail R arranged in grid pattern in a plan view, a transport efficiency of the transport vehicle V can be improved.

The transport system SYS includes a travel path, which is the grid-patterned rail R extending horizontally and being suspended. The travel unit 20 includes the travel wheel 21 rolling on the grid-patterned rail R. The transfer unit 18 includes the article holder 13 holding an article M below the grid-patterned rail R. With this configuration, in so-called grid system, a transport efficiency of the transport vehicle V can be improved.

In the transport system SYS, the map MP is memorized in the system controller 5, and using the map MP, the system controller 5 determines an access direction that minimizes the blocking zone 3 as the first direction. This enables to efficiently minimize an area of the blocking zone 3 at the time of transferring an article M.

In the transport system SYS, the transfer unit 18 of the transport vehicle V moves relative to the travel unit 20 in the direction perpendicular to the travel direction of the transport vehicle V within horizontal plane. When an area of the blocking zone 3 when the transport vehicle V accesses to the load port P in the first direction is smaller than an area of the blocking zone 3 when the transport vehicle V accesses to the load port P in the second direction, the circumstances arise as follows: when the transport vehicle V accesses to the load port P in the first direction, the transport unit 18 does not protrude from the travel unit 20 in a plan view at the time of transferring an article M. When the transport vehicle V accesses to the load port P in the second direction, the transport unit 18 protrudes from the travel unit 20 in a plan view at the time of transferring the article M. Therefore, in the transport system SYS thus configured, a transport efficiency of the transport vehicle can be improved.

In the transport system SYS, the number of blocks when the transport vehicle V accesses to the load port P in the first direction is equal to that when the transport vehicle V accesses to the load port P in the second direction, the first direction is more appropriate to the arrangement direction of the load port P than the second direction. Therefore, when the transport vehicle V accesses to the load port P in transferring an article M, the priority of the arrangement direction of the load port P can be increased. When the access direction to the load port P is determined, minimization of the number of blocks can be the first priority and arrangement of the load port P can be the second priority. Therefore, for example, an article M can be smoothly moved from/to the load port P arranged, thereby improving a transport efficiency of the transport vehicle V.

In the transport system SYS, if there is no arrangement direction of the load port P, the arrival time required for an access of the transport vehicle V toward the load port P in the first direction is shorter than the arrival time required for an access of the transport vehicle V toward the load port P in the second direction. Therefore, the priority of the arrival time to the transfer position for an access of the transport vehicle V toward the load port P to transfer an article M can be raised. Therefore, for a determination of the access direction toward the load port P, the first priority can be a minimization of the number of blocks, the second priority can be an arrangement of the load port P, and the third priority can be the arrival time to the transfer position. This enables a transport efficiency of the transport vehicle V to be improved.

In the transport system SYS, the arrival time required for an access of the transport vehicle V toward the load port P in the first direction may be longer than the arrival time required for an access of the transport vehicle V toward the load port P in the second direction. In this example, in transferring an article M, the transfer vehicle V can access to the load port P so that an area of the blocking zone 3 can become smaller though the arrival time is longer.

In the transport vehicle system SYS which is a grid system, when the transport vehicle V transfer an article M, the number of blocks can be suppressed to become larger, thereby not interfering with entry of other transport vehicles. As a result, a transport efficiency of the transport vehicle V can be improved.

Figure 13:
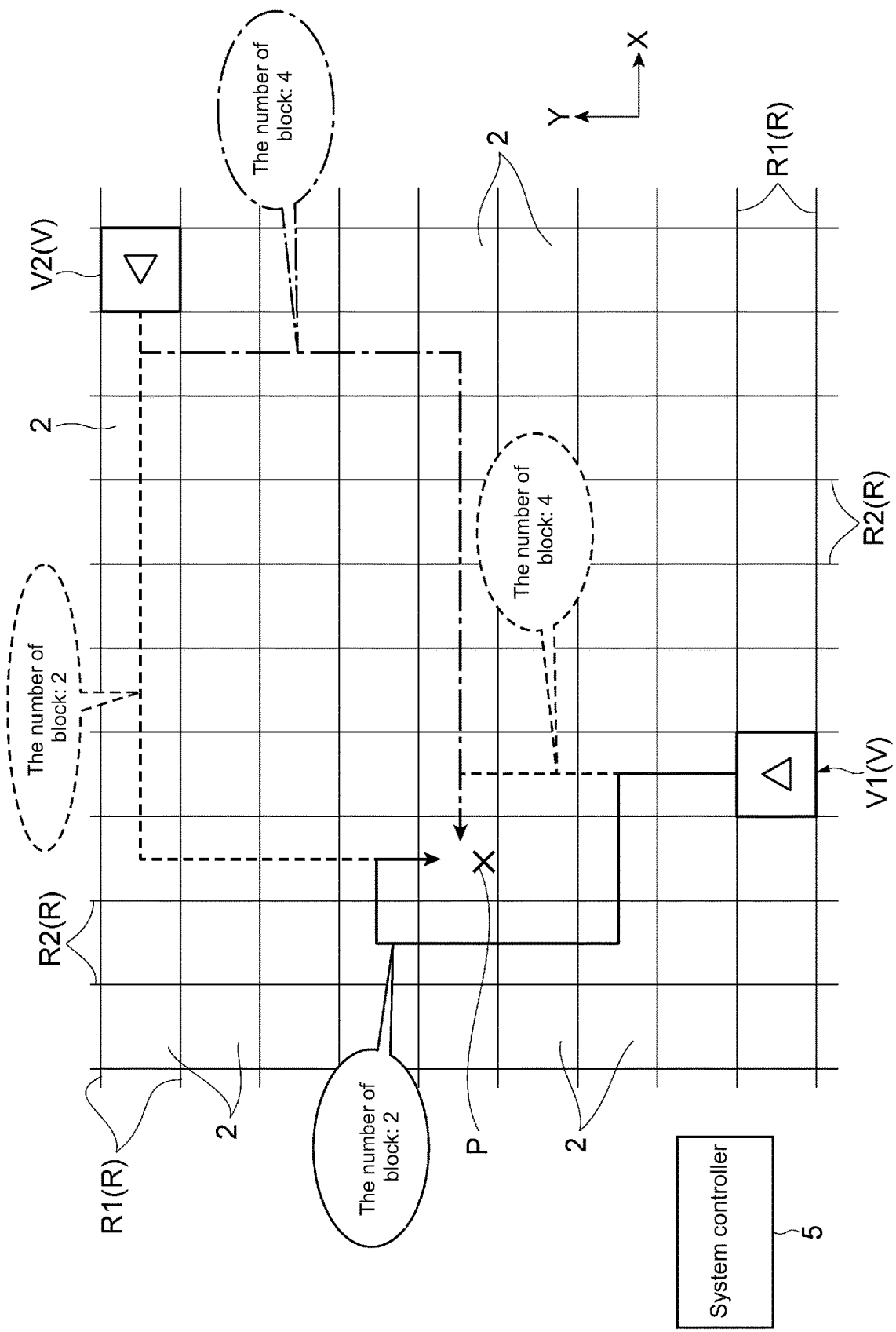
FIG. 13 is a top view explaining another example of operations of the transport system.

FIG. 13 is a top view explaining another example of operations of the transport system SYS. FIG. 13 shows an example of operations when there are a plurality of transport vehicles V (first transport vehicle V and second transport vehicle V2) around the load port P.

Using the map MP, the system controller 5 acquires the number of blocks when the access direction is X direction and the number of blocks when the access direction is Y direction from the port number of the load port P to be accessed. The number of blocks when the access direction is X direction is 4 and the number of blocks when the access direction is Y direction is 2. Thus, the system controller 5 determines Y direction as the first direction.

The arrival time required for an access of the first transport vehicle V1 toward the load port P in the first direction is shorter than the arrival time required for an access of the second transport vehicle V2 toward the load port P in the first direction. Therefore, the system controller 5 allocates the transport command including travel command to travel along the route to the load port P in the first direction to the first transport vehicle V1. As a result, the first transport vehicle V1 to which the transport command is allocated travels toward the load port P along the route to the load port P.

In the transport system SYS, the system controller 5 transmits a command to a transport vehicle V of which the arrival time required for an access of the transport vehicle V toward the load port in the first direction is the shortest of a plurality of transport vehicles V. This enables a transport efficiency of the transport vehicles V to be improved.

With respect to the above described transport system SYS, a simulation was carried out to verify a transport efficiency of the transport vehicle V. In the simulation, the model corresponding to the transport system SYS, in which minimization of the number of blocks is the most priority for determination of the access direction to the load port P, is an example. The model, in which minimization of the arrival time toward the transfer position is the most priority, is a Comparative Example 1, and the model, in which the access direction is random, is a Comparative Example 2. The simulation is carried out on 120 to 200 transport vehicles V. As a result of this simulation, the example reaches the best results in all items of transport completion rate, travel time (average and variance value), and vehicle operating rate, which certifies the above effect of the transport system SYS that a transport efficiency of the transport vehicle V can be improved.

A preferred example was described as above. However, that example is not limiting and various changes may be made without departing from the scope of this disclosure.

In the transport system SYS according to the above preferred example, the system controller 5 determines the load port P to be accessed by the transport vehicle V and then calculate the number of blocks (information on an area of the blocking zone 3) for each of a plurality of the access directions to the load port P. On the basis of the calculated results, the system controller 5 may determine the access direction that minimizes the number of blocks as the first direction. With this configuration, every time the transfer vehicle V accesses to the load port P, the number of blocks is calculated and the first direction is determined. Therefore, even if a situation occurs such that the traveling environment of the transport vehicle is temporarily changed for some reason, an area of the blocking zone can be surely minimized depending on the situation at the time of an article transfer.

In the above preferred example, when the number of blocks when the transport vehicle V accesses to the load port P in the first direction is equal to the number of blocks when the transport vehicle V accesses to the load port P in the second direction, regard-less of the arrangement direction of the load port P, the transport system SYS may be configured as follows. The arrival time required for an access of the transport vehicle V toward the load port P in the first direction may be shorter than that when the transport vehicle V accesses to the load port P in the second direction. With this configuration, for example, the system controller 5 determines an access direction that allow the number of blocks to be the shortest of a plurality of access directions that minimizes the number of blocks as the first direction. Therefore, for an access of the transport vehicle V toward the load port P to transfer an article M, the priority of the arrival time toward the transfer position can be higher. In other words, for a determination of the access direction toward the load port P, the first priority can be minimization of the number of blocks and the second priority can be the arrival time to the transfer position.

In the above preferred example, the grid system is employed as the transport system SYS. However, the transport system SYS is not limited to the grid system. For example, AGV(Automated Guided Vehicle) or known systems including a grid-patterned traveling rail may be employed as the transport system. In the above preferred example, the transport vehicle V holds an article M below the grid-patterned rail R. However, the body 10 may be arranged above the grid-patterned rail R and the transport vehicle V may hold an article M above the grid-patterned rail R.

In the above preferred example, the number of blocks is used as an area of the blocking zone 3. However, without limitation to the number of blocks, the area of the blocking zone 3 may be directly used. Also other parameters related to an area of the blocking zone 3 may be applied. In the above preferred example, the word 'equal' tolerates any errors in design or production.

The invention claimed is:

1. A transport system comprising:
a plurality of transport vehicles; and
a controller that controls the plurality of transport vehicles,
wherein the transport vehicle comprises:
a travel unit that causes the transport vehicle travel; and
a transfer section that moves substantially horizontally to the travel unit and transfers an article from/to a placement table,
wherein, when the transport vehicle transfers an article from/to the placement table, the controller performs a blocking control that prohibits transport vehicles other than the transport vehicle from entering a blocking zone corresponding to an area occupied by the transport vehicle at the time of the article transfer in a plan view,
the transport vehicle travels along the access route to the placement table in a first direction when transferring an article from/to the placement table, and
an area of the blocking zone when the transport vehicle accesses to the placement table in the first direction is equal to or less than an area of the blocking zone when the transport vehicle accesses to the placement table in a second direction different from the first direction.

2. The transport system according to claim 1,
wherein the transport vehicle is movably provided along a travel path arranged in a grid pattern in a plan view,
the first direction is perpendicular to the second direction,
the blocking zone is defined by a cell corresponding to a square space formed by the travel path, and
a size of an area of the blocking zone corresponds to the number of cells that define the blocking zone.

3. The transport system according to claim 2,
wherein the travel path is a rail extending horizontally and suspended,
the travel unit includes a travel wheel that rolls on the rail, and
the transfer section includes an article holder that holds an article below the rail.

4. The transport system according to claim 1,
wherein the controller memorizes a map in which a plurality of the placement tables and information on an area of the blocking zone defined for each of a plurality of access directions toward the placement table are associated with each other, and
the controller determines the access direction that minimizes the area of the blocking zone as the first direction using the map.

5. The transport system according to claim 1, wherein, after determining the placement table to be accessed by the transport vehicle, the controller calculates information on an area of the blocking zone for each of a plurality of access directions toward the placement table and determines the access direction that minimizes the area of the blocking zone as the first direction on the basis of the calculated information.

6. The transport system according to claim 1,
wherein the transfer section of the transport vehicle moves relative to the travel unit in a direction perpendicular to a travel direction of the transport vehicle within horizontal plane,
an area of the blocking zone when the transport vehicle accesses to the placement table in the first direction is smaller than an area of the blocking zone when the transport vehicle accesses to the placement table in the second direction, when the transport vehicle accesses to the placement table in the first direction, the transfer section does not protrude from the travel unit in a plan view at the time of the article transfer, and when the transport vehicle accesses to the placement table in the second direction, the transfer section protrudes from the travel unit in a plan view at the time of the article transfer.

7. The transport system according to claim 1, wherein a plurality of placement tables including the placement table are arranged in parallel in a predetermined arrangement direction, an area of the blocking zone when the transport vehicle accesses to the placement table in the first direction is equal to an area of the blocking zone when the transport vehicle accesses to the placement table in the second direction, and the first direction is more parallel to the predetermined arrangement direction than the second direction.

8. The transport system according to claim 7, wherein, when there is no predetermined arrangement direction, the arrival time required until the transport vehicle accesses to the placement table in the first direction and arrives at a position that allows the transport vehicle to transfer an article from/to the placement table is shorter than the arrival time required until the transport vehicle accesses to the placement table in the second direction and arrives at a position that allows the transport vehicle to transfer an article from/to the placement table.

9. The transport system according to claim 1, wherein an area of the blocking zone when the transport vehicle accesses to the placement table in the first direction is equal to an area of the blocking zone when the transport vehicle accesses to the placement table in the second direction, and the arrival time required until the transport vehicle accesses to the placement table in the first direction and arrives at a position that allows the transport vehicle to transfer an article from/to the placement table is shorter than the arrival time required until the transport vehicle accesses to the placement table in the second direction and arrives at a position that allows the transport vehicle to transfer an article from/to the placement table.

10. The transport system according to claim 1, wherein the arrival time required until the transport vehicle accesses to the placement table in the first direction and arrives at a position that allows the transport vehicle to transfer an article from/to the placement table is longer than the arrival time required until the transport vehicle accesses to the placement table in the second direction and arrives at a position that allows the transport vehicle to transfer an article from/to the placement table.

11. The transport system according to claim 1, wherein the controller transmits a command to travel along the route to a transport vehicle of which the arrival time required until the transport vehicle accesses to the placement table in the first direction and arrives at a position that allows the transport vehicle to transfer an article from/to the placement table is the shortest of a plurality of the transport vehicles.

12. A grid system comprising:

a rail extending horizontally and arranged in a grid pattern;

a plurality of transport vehicles capable of traveling along the rail; and a controller that controls the plurality of transport vehicles, wherein the transport vehicle comprises a travel unit that causes the transport vehicle travel and a transfer section that moves relative to the travel unit in a direction perpendicular to a travel direction of the transport vehicle within a substantially horizontal plane and transfers an article from/to a placement table, wherein, when the transport vehicle transfers an article from/to the placement table, the controller performs a blocking control to prohibit transport vehicles other than the transport vehicle from entering a blocking zone that corresponds to an area occupied by the transport vehicle at the time of the article transfer in a plan view and is defined by a cell corresponding to a square space formed by the rail, and when there is a first direction which is an access direction that prevents the transfer section from protruding to other cells adjacent to the cells occupied by the travel unit when the transfer section is moved to transfer an article, the transport vehicle accesses to the placement table in the first direction.

* * * * *